US012696791B2

(12) United States Patent
Komatsu et al.

(10) Patent No.: US 12,696,791 B2
(45) Date of Patent: Jul. 28, 2026

(54) SENSOR PACKAGE WITH CAVITY CREATED USING SACRIFICIAL MATERIAL

(71) Applicant: TEXAS INSTRUMENTS INCORPORATED, Dallas, TX (US)

(72) Inventors: Daiki Komatsu, Beppu (JP); Makoto Shibuya, Tokyo (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1156 days.

(21) Appl. No.: 17/667,843

(22) Filed: Feb. 9, 2022

(65) Prior Publication Data

US 2023/0253281 A1      Aug. 10, 2023

(51) Int. Cl.
| | |
|---|---|
| *H10W 74/10* | (2026.01) |
| *H10W 70/04* | (2026.01) |
| *H10W 70/40* | (2026.01) |
| *H10W 74/01* | (2026.01) |
| *H10W 90/00* | (2026.01) |

(52) U.S. Cl.
CPC ......... *H10W 74/124* (2026.01); *H10W 70/04* (2026.01); *H10W 70/435* (2026.01); *H10W 74/016* (2026.01); *H10W 90/756* (2026.01)

(58) Field of Classification Search
None
See application file for complete search history.

(56) References Cited

U.S. PATENT DOCUMENTS

| | | | | |
|---|---|---|---|---|
| 6,503,780 B1 * | 1/2003 | Glenn | ................... | H10F 39/804 |
| | | | | 438/106 |
| 8,680,647 B2 * | 3/2014 | Yu | ........................... | H01L 24/19 |
| | | | | 257/532 |
| 2008/0303128 A1 * | 12/2008 | Yang | ................... | H10W 70/411 |
| | | | | 257/676 |
| 2010/0200898 A1 * | 8/2010 | Lin | ......................... | H10F 77/50 |
| | | | | 257/E31.11 |
| 2013/0221455 A1 * | 8/2013 | Manack | ............... | B81B 7/0067 |
| | | | | 257/431 |
| 2015/0014793 A1 * | 1/2015 | Yow | ....................... | B81C 1/0023 |
| | | | | 438/51 |
| 2018/0285649 A1 * | 10/2018 | Shi | ................... | G08B 13/19613 |
| 2020/0105638 A1 * | 4/2020 | Chiang | .................. | H01L 21/56 |
| 2020/0158673 A1 * | 5/2020 | Nakane | ............... | H01L 25/0657 |
| 2020/0235065 A1 * | 7/2020 | Chang | ................... | H10W 90/00 |
| 2021/0287970 A1 * | 9/2021 | Tuncer | ............... | H10W 70/427 |
| 2021/0343638 A1 * | 11/2021 | Chu | .................... | H01L 23/3185 |
| 2021/0366800 A1 * | 11/2021 | Lee | ......................... | H01L 23/31 |
| 2023/0014450 A1 * | 1/2023 | Yu | ........................... | H01L 24/19 |
| 2023/0352357 A1 * | 11/2023 | Chiang | ............... | H01L 23/3171 |

* cited by examiner

*Primary Examiner* — Bilkis Jahan
(74) *Attorney, Agent, or Firm* — Dawn Jos; Frank D. Cimino

(57) ABSTRACT

An integrated circuit package includes a semiconductor die having a first surface and a second surface. The first surface is attached to a top surface of a die attach pad, and the second surface has a sensing area thereon. A mold compound covers or encapsulates at least a portion of the die attach pad and the semiconductor die. A channel is formed in a top portion of the mold compound. The channel extends from a first side of the mold compound to a second side of the mold compound. A cavity is formed between the channel and the sensing area so that the sensing area is exposed to the environment.

20 Claims, 10 Drawing Sheets

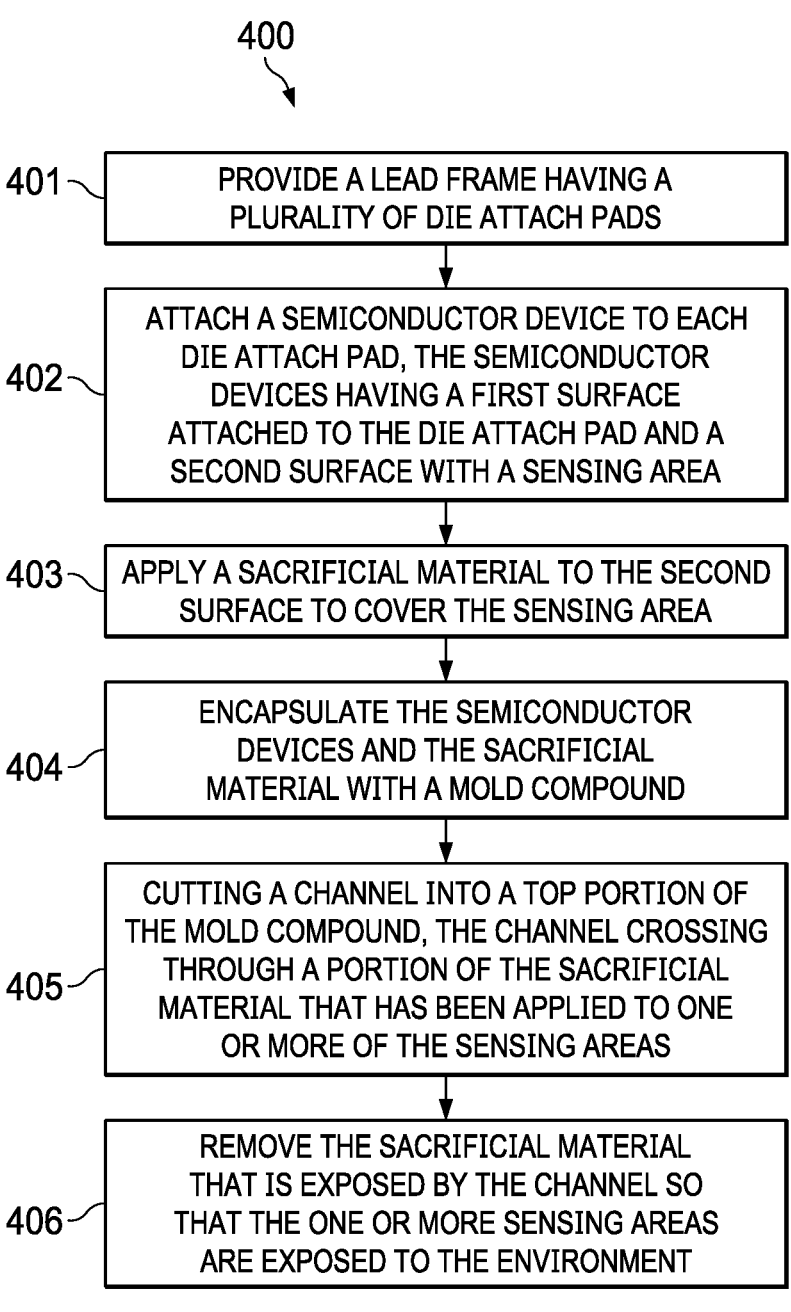

400

401 — PROVIDE A LEAD FRAME HAVING A PLURALITY OF DIE ATTACH PADS

402 — ATTACH A SEMICONDUCTOR DEVICE TO EACH DIE ATTACH PAD, THE SEMICONDUCTOR DEVICES HAVING A FIRST SURFACE ATTACHED TO THE DIE ATTACH PAD AND A SECOND SURFACE WITH A SENSING AREA

403 — APPLY A SACRIFICIAL MATERIAL TO THE SECOND SURFACE TO COVER THE SENSING AREA

404 — ENCAPSULATE THE SEMICONDUCTOR DEVICES AND THE SACRIFICIAL MATERIAL WITH A MOLD COMPOUND

405 — CUTTING A CHANNEL INTO A TOP PORTION OF THE MOLD COMPOUND, THE CHANNEL CROSSING THROUGH A PORTION OF THE SACRIFICIAL MATERIAL THAT HAS BEEN APPLIED TO ONE OR MORE OF THE SENSING AREAS

406 — REMOVE THE SACRIFICIAL MATERIAL THAT IS EXPOSED BY THE CHANNEL SO THAT THE ONE OR MORE SENSING AREAS ARE EXPOSED TO THE ENVIRONMENT

FIG. 4

SENSOR PACKAGE WITH CAVITY CREATED USING SACRIFICIAL MATERIAL

BACKGROUND

Integrated sensor packages typically include a sensor area that is exposed to the surrounding environment to sense features such as the presence of a gas or atmospheric humidity. A cavity is required in the integrated sensor package to expose the sensor area to the environment. The formation of the cavity has traditionally been a difficult process that required attaching a lid to the package or using complex mold steps.

SUMMARY

Examples herein use a sacrificial layer to easily form a cavity that exposes a sensing area to the environment through a channel cut into the top of a molding.

In one example, an integrated circuit package includes a die attach pad having a top surface, and a semiconductor die having a first surface and a second surface. The first surface is attached to the top surface of the DAP, and the second surface has a sensing area formed thereon. A mold compound encapsulates at least a portion of the die attach pad and the semiconductor die. A channel is formed in a top portion of the mold compound. The channel extends from a first side of the mold compound to a second side of the mold compound. A cavity is formed between the channel and the sensing area so that the sensing area is exposed to the environment.

In another example, a sensor package includes a sensor attach area on a lead frame, and a sensor device having a first surface and a second surface. The first surface is attached to the sensor attach area, and the second surface has a sensing area. A mold compound covers at least a portion of the lead frame and the sensor device. A channel is formed in a top portion of the mold compound. The channel extends across a width of the mold compound. A cavity is formed between the channel and the sensing area so that the sensing area is exposed to the environment.

An example method of manufacturing a semiconductor package includes the steps of providing a lead frame having a plurality of die attach pads, adhering a semiconductor device to each die attach pad, wherein the semiconductor devices having a first surface attached to the die attach pad and a second surface with a sensing area, applying a sacrificial material to the second surface to cover the sensing area, covering the semiconductor devices and the sacrificial material with a mold compound, cutting a channel into a top portion of the mold compound, wherein the channel crossing through a portion of the sacrificial material that has been applied to one or more of the sensing areas, and removing sacrificial material that is exposed by the channel so that the one or more sensing areas are exposed to the environment.

BRIEF DESCRIPTION OF THE DRAWINGS

Figure 2A:
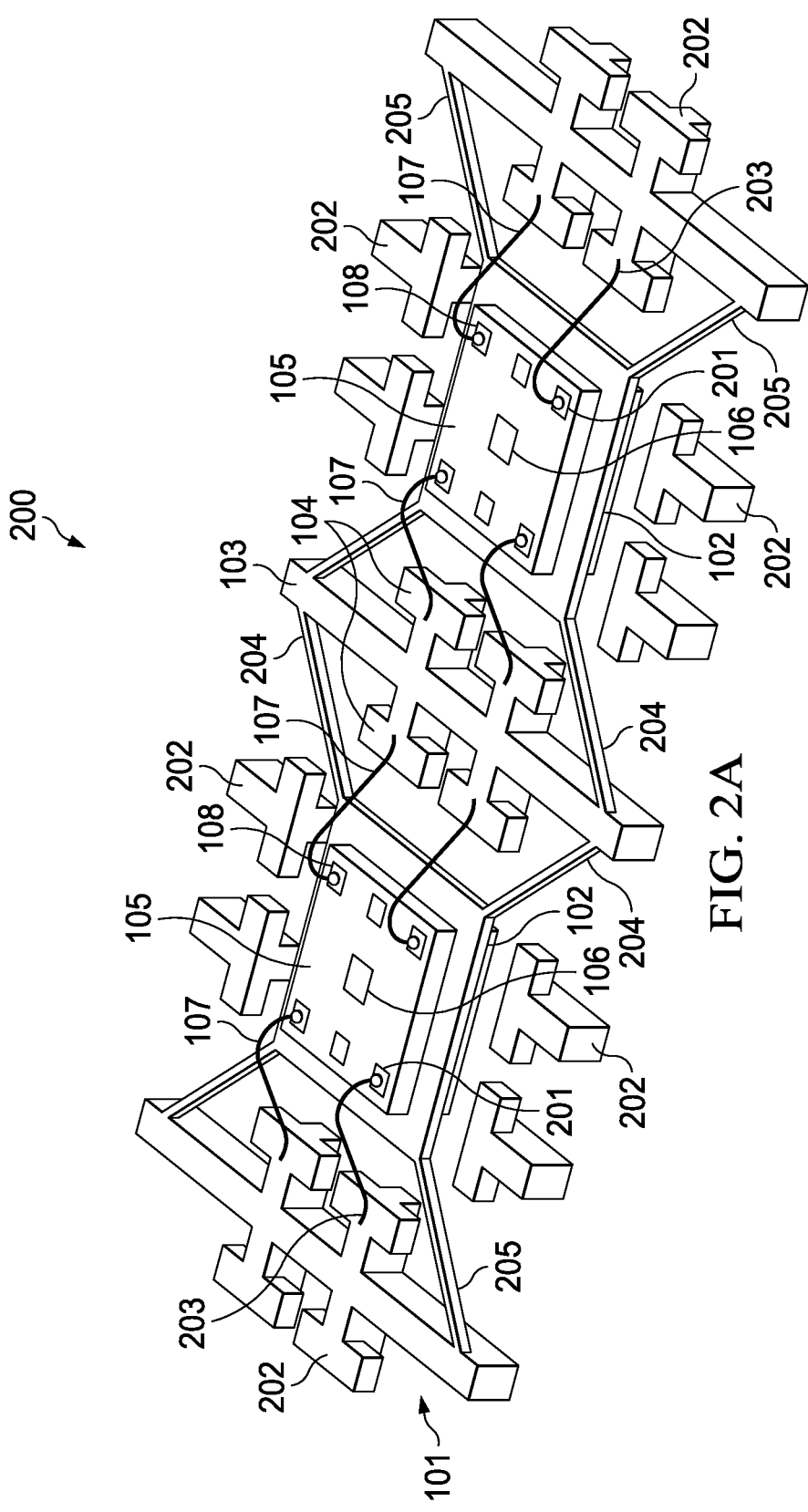
Figure 2B:
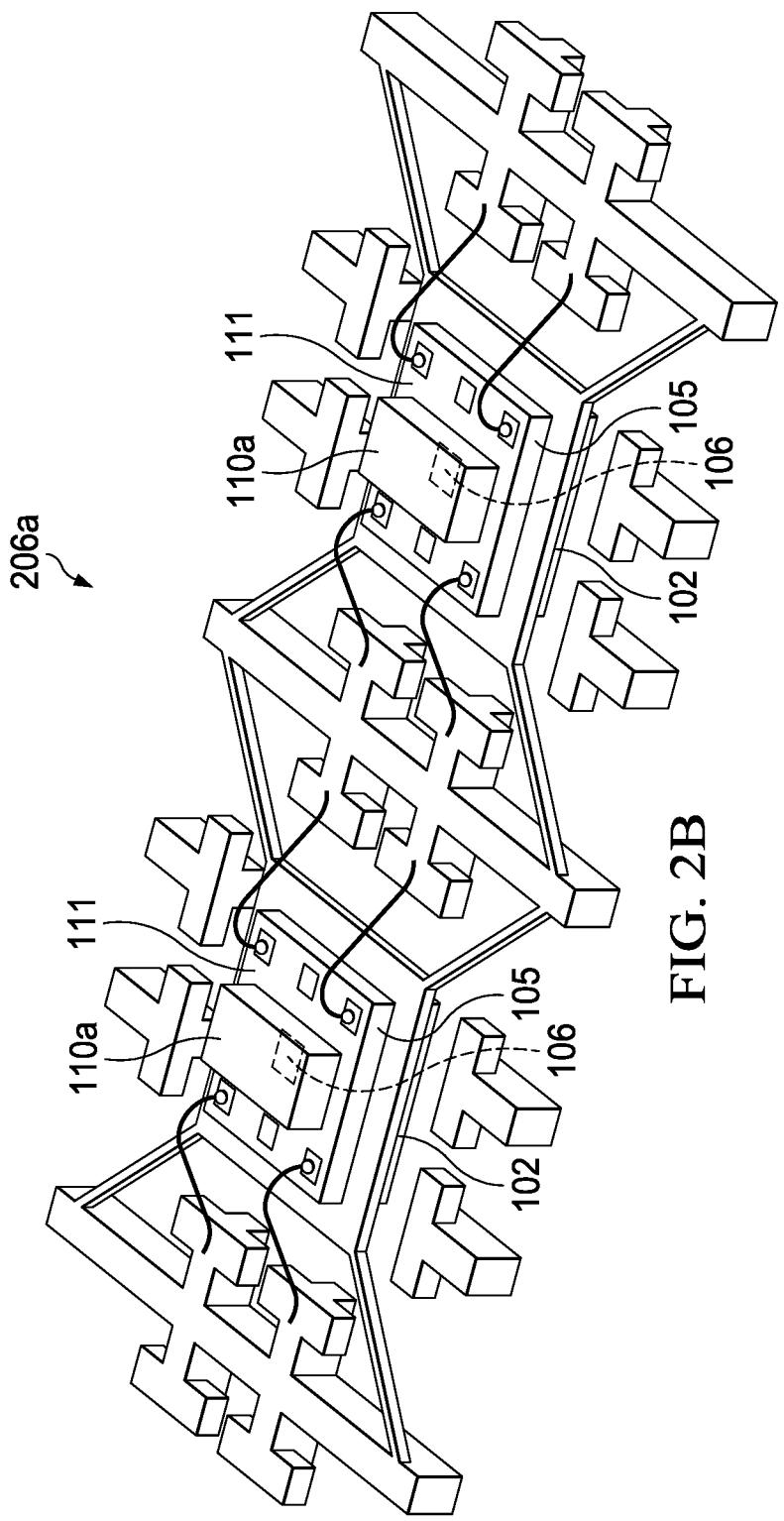
Figure 2C:
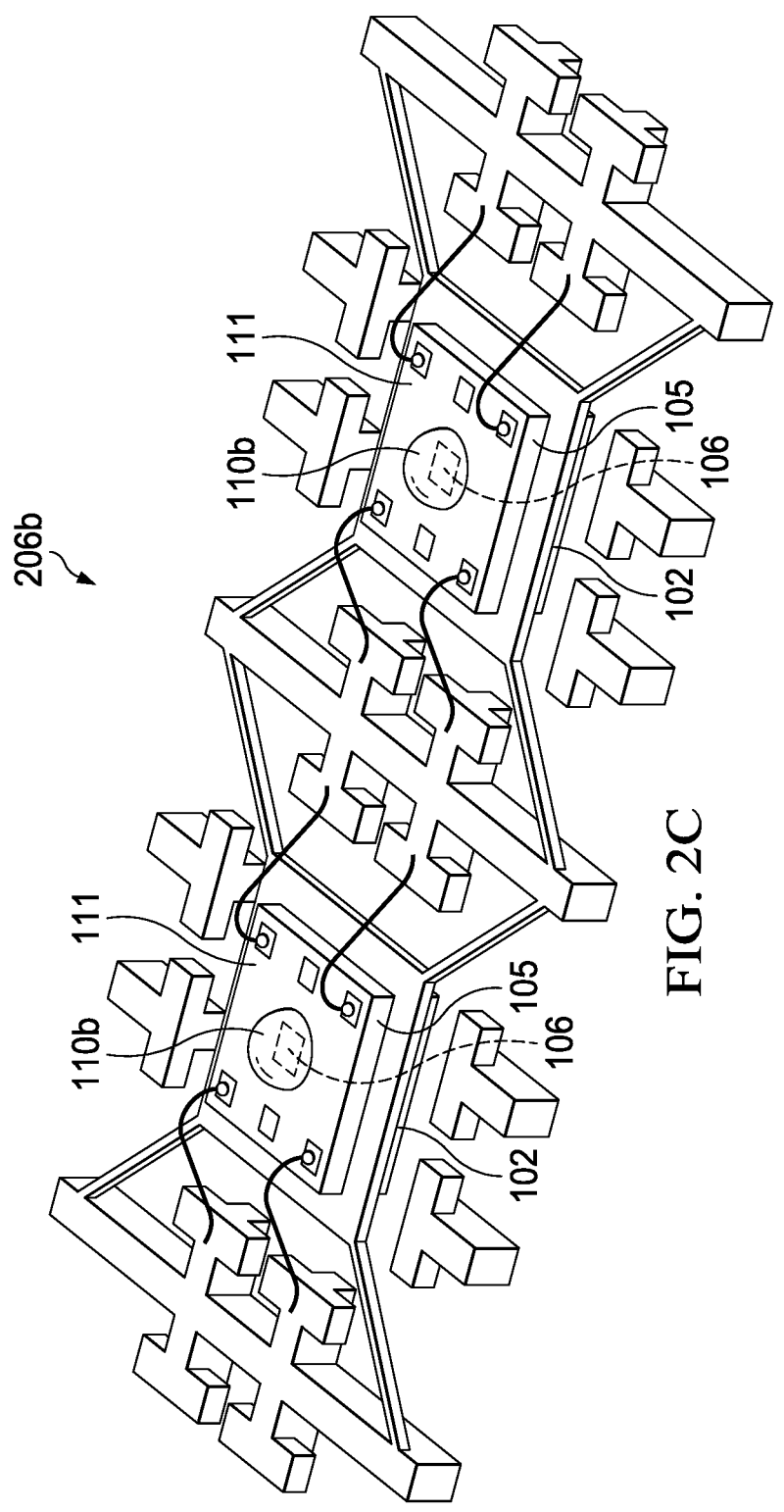
Figure 2D:
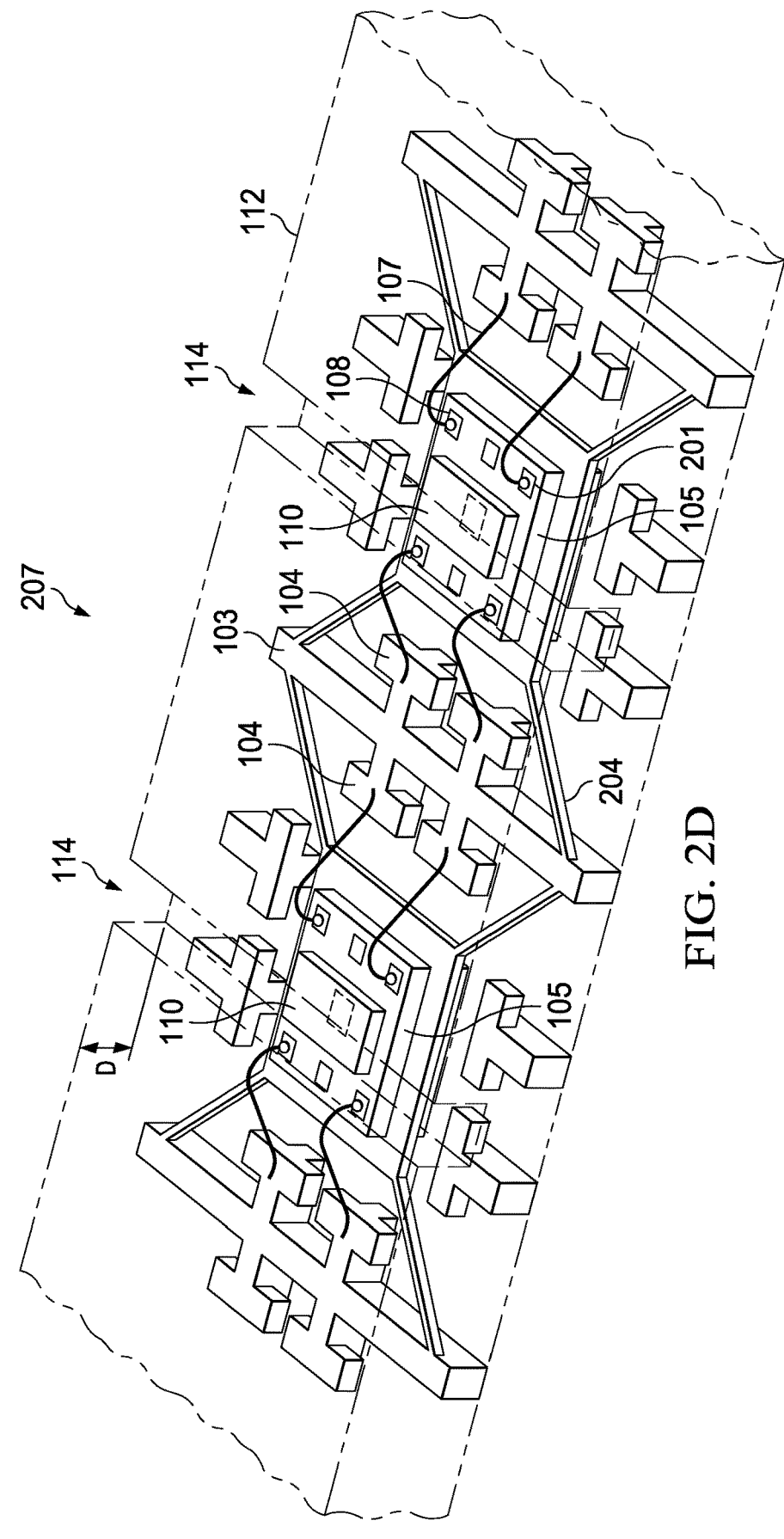
Figure 2E:
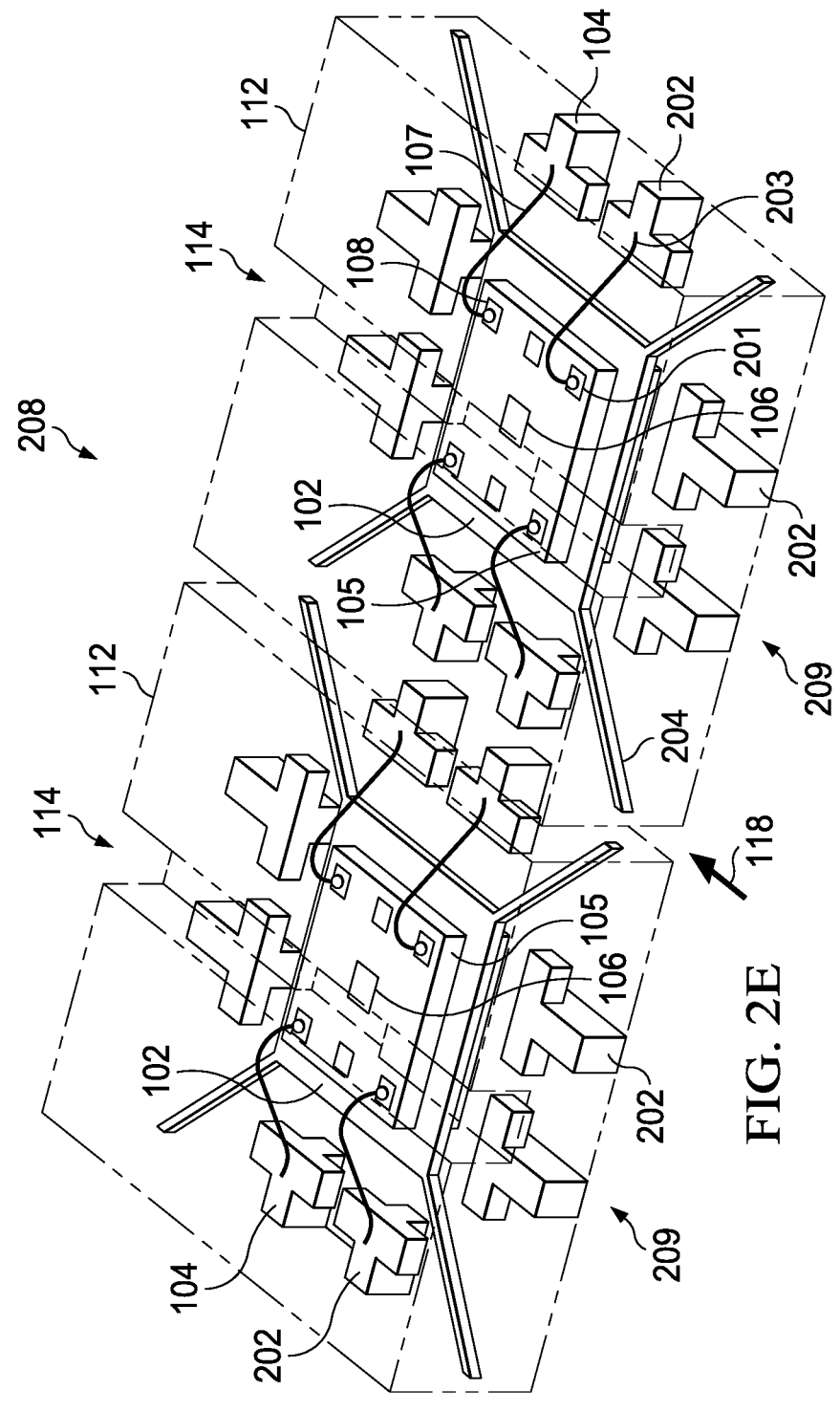
Figure 3A:
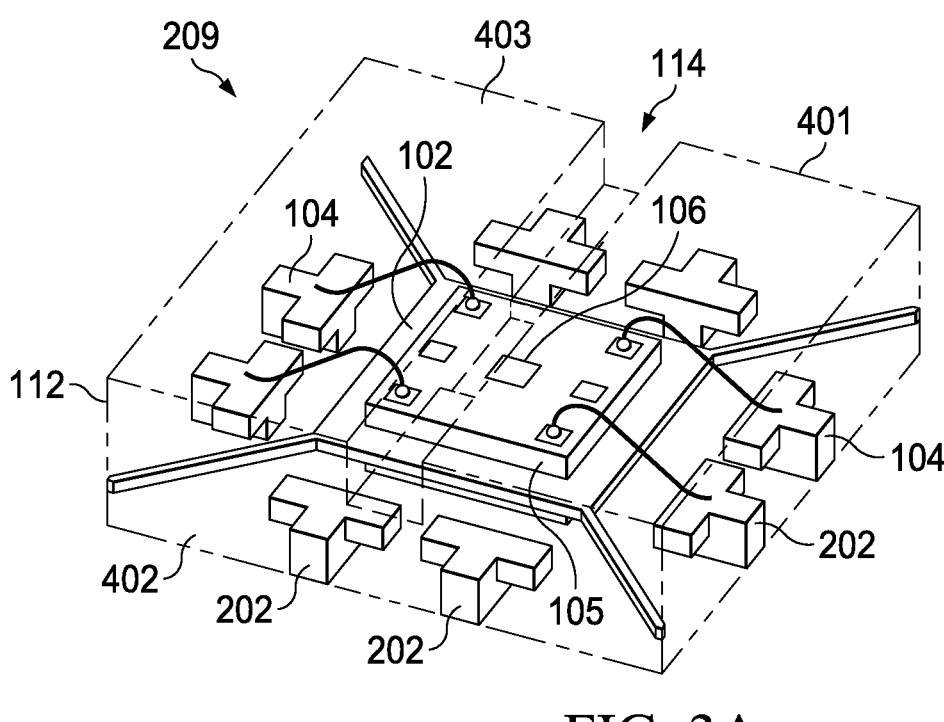
Figure 3B:
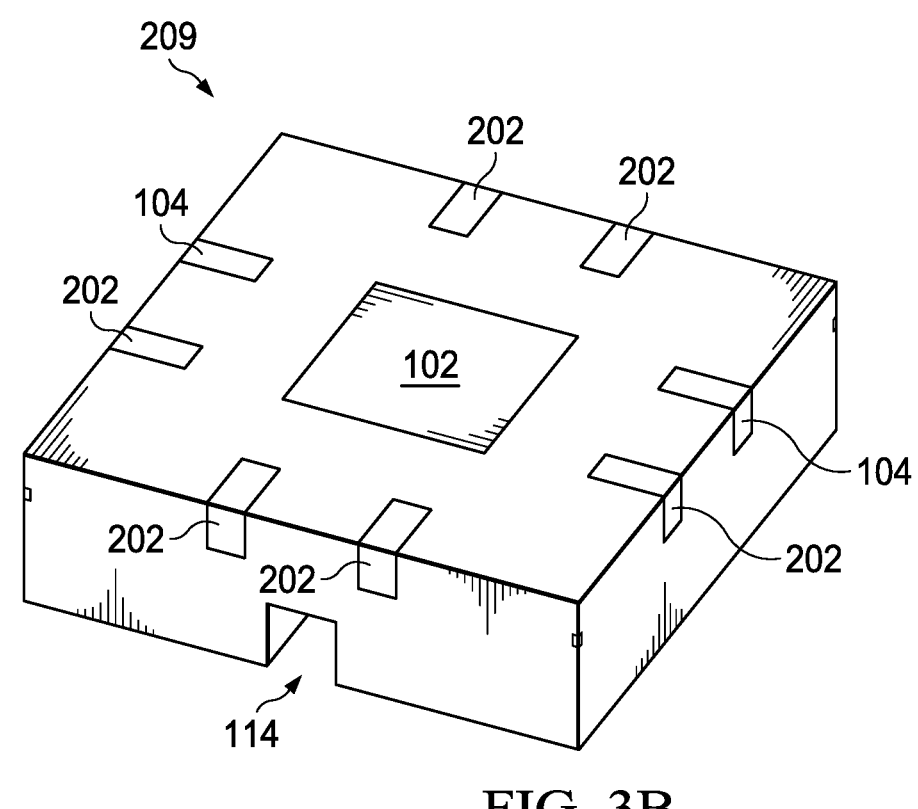

Having thus described the invention in general terms, reference will now be made to the accompanying drawings, wherein:

FIGS. 1A-H illustrate a cross section views of steps in the manufacture of an integrated circuit package having a cavity for a sensing area;

FIGS. 2A-E illustrate isometric views of various steps in the manufacture of the integrated circuit package shown in FIGS. 1A-H;

FIG. 3A illustrates a top view of a completed integrated circuit package manufactured as shown in FIGS. 1A-H and 2A-E; and FIG. 3B illustrates a bottom view of the completed integrated circuit package as shown in FIG. 3A.

FIG. 4 is a flowchart illustrating a method of manufacturing a semiconductor package according to one example.

DETAILED DESCRIPTION

The present disclosure is described with reference to the attached figures. The figures are not drawn to scale, and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

In the drawings, like reference numerals refer to like elements throughout, and the various features are not necessarily drawn to scale. Corresponding numerals and symbols in the different figures generally refer to corresponding parts, unless otherwise indicated. In the following discussion and in the claims, the terms "including," "includes," "having," "has," "with," or variants thereof are intended to be inclusive in a manner similar to the term "comprising," and thus should be interpreted to mean "including, but not limited to . . . " Also, the terms "coupled," "couple," and/or or "couples" is/are intended to include indirect or direct electrical or mechanical connection or combinations thereof. For example, if a first device couples to or is electrically coupled with a second device that connection may be through a direct electrical connection, or through an indirect electrical connection via one or more intervening devices and/or connections. Terms such as "top," "bottom," "front," "back," "over," "above," "under," "below," and such, may be used in this disclosure. These terms should not be construed as limiting the position or orientation of a structure or element but should be used to provide spatial relationship between structures or elements.

The term "semiconductor device" is used herein. A semiconductor device can be a discrete semiconductor device such as a bipolar transistor, a few discrete devices such as a pair of power FET switches fabricated together on a single semiconductor die, or a semiconductor die can be an integrated circuit with multiple semiconductor devices such as the multiple capacitors in an A/D converter. The semiconductor device can include passive devices such as resistors, inductors, filters, sensors, or active devices such as transistors. The semiconductor device can be an integrated circuit with hundreds or thousands of transistors coupled to form a functional circuit, for example a microprocessor or memory device. The semiconductor device may also be referred to herein as a "semiconductor die."

The term "integrated circuit package" is used herein. An integrated circuit package has at least one semiconductor device electrically coupled to terminals and has a package body that protects and covers the semiconductor device. In some arrangements, multiple semiconductor devices can be packaged together. For example, a power field effect transistor (FET) semiconductor device and a second semiconductor device (such as a gate driver die or a controller die)

can be packaged together to from a single packaged electronic device. Additional components such as passives can be included in the packaged electronic device. The semiconductor device is mounted with a package substrate that provides conductive leads. A portion of the conductive leads form the terminals for the packaged device. In wire bonded integrated circuit packages, bond wires couple conductive leads of a package substrate to bond pads on the semiconductor device. The integrated circuit package can have a package body formed by a thermoset epoxy resin mold compound in a molding process, or by the use of epoxy, plastics, or resins that are liquid at room temperature and are subsequently cured. The package body may provide a hermetic package for the packaged device. The package body may be formed in a mold using an encapsulation process, however, a portion of the leads of the package substrate are not covered during encapsulation, these exposed lead portions form the terminals for the integrated circuit package. The integrated circuit package may also be referred to herein as a "semiconductor package" or a "sensor package."

A package substrate is a substrate arranged to receive a semiconductor die and to support the semiconductor die in a completed semiconductor device package. Package substrates useful with the arrangements include conductive lead frames, which can be formed from copper, aluminum, stainless steel, steel, and alloys such as Alloy 42 and copper alloys. The lead frames can include a die pad with a die side surface for mounting a semiconductor die, and conductive leads arranged near and spaced from the die pad for coupling to bond pads on the semiconductor die using wire bonds, ribbon bonds, or other conductors. In example arrangements, a heat slug is attached to the package substrate, and the heat slug has a die mounting area for mounting semiconductor devices. The lead frames can be provided in strips or arrays. The conductive lead frames can be provided as a panel with strips or arrays of unit device portions in rows and columns. Semiconductor devices can be placed on respective unit device portions within the strips or arrays. A semiconductor device can be placed on a die mount area for each packaged semiconductor device. Die attach or die adhesive can be used to mount the semiconductor devices. In wire bonded packages, bond wires can couple bond pads on the semiconductor devices to the leads of the lead frames. The lead frames may have plated portions in areas designated for wire bonding, for example silver, nickel, gold, or palladium plating can be used. After the bond wires are in place, a portion of the package substrate, the semiconductor device, and at least a portion of the die pad can be covered with a protective material such as a mold compound. More than one semiconductor device can be mounted to a package substrate for each unit.

The term "die attach pad" is used herein. A die attach pad is portion of a metal lead frame that is adapted for mounting a semiconductor device or semiconductor die. The semiconductor device may be mounted on the die attach pad by a layer of die attachment material that electrically and physically connects the semiconductor device to the lead frame.

The term "bond pad" is used herein. A bond pad is an area on a semiconductor device that allows the device to be electrically coupled to external circuits, such as by wire bonding to a lead frame or printed circuit board. The bond pad may be formed of a variety of materials, such as aluminum, gold, or copper. Additionally, the bond pad may take a variety of configurations.

The term "cavity" is used herein. A cavity is a hollow area or empty space within a structure, such as a semiconductor package. The cavity may be formed, for example, by removing material to create the hollow area or empty space.

The term "channel" is used herein. A channel is a long narrow furrow, trench, or groove cut by a tool such as a saw blade.

Semiconductor packages having a sensor element, such as a gas sensor or a humidity sensor, need a cavity or opening that exposes the sensor element to the environment. The cavity allows for sensing of surrounding environment by the sensor element. In some devices, cavity construction is a complex process requiring forming of cavities by attaching lids or using a film-assisted mold processes. In the device disclosed herein, the cavity is formed using a sacrificial layer in combination with a partial cut into the top of the mold compound that encapsulates the device.

Figures 1A, 1B, 1C:
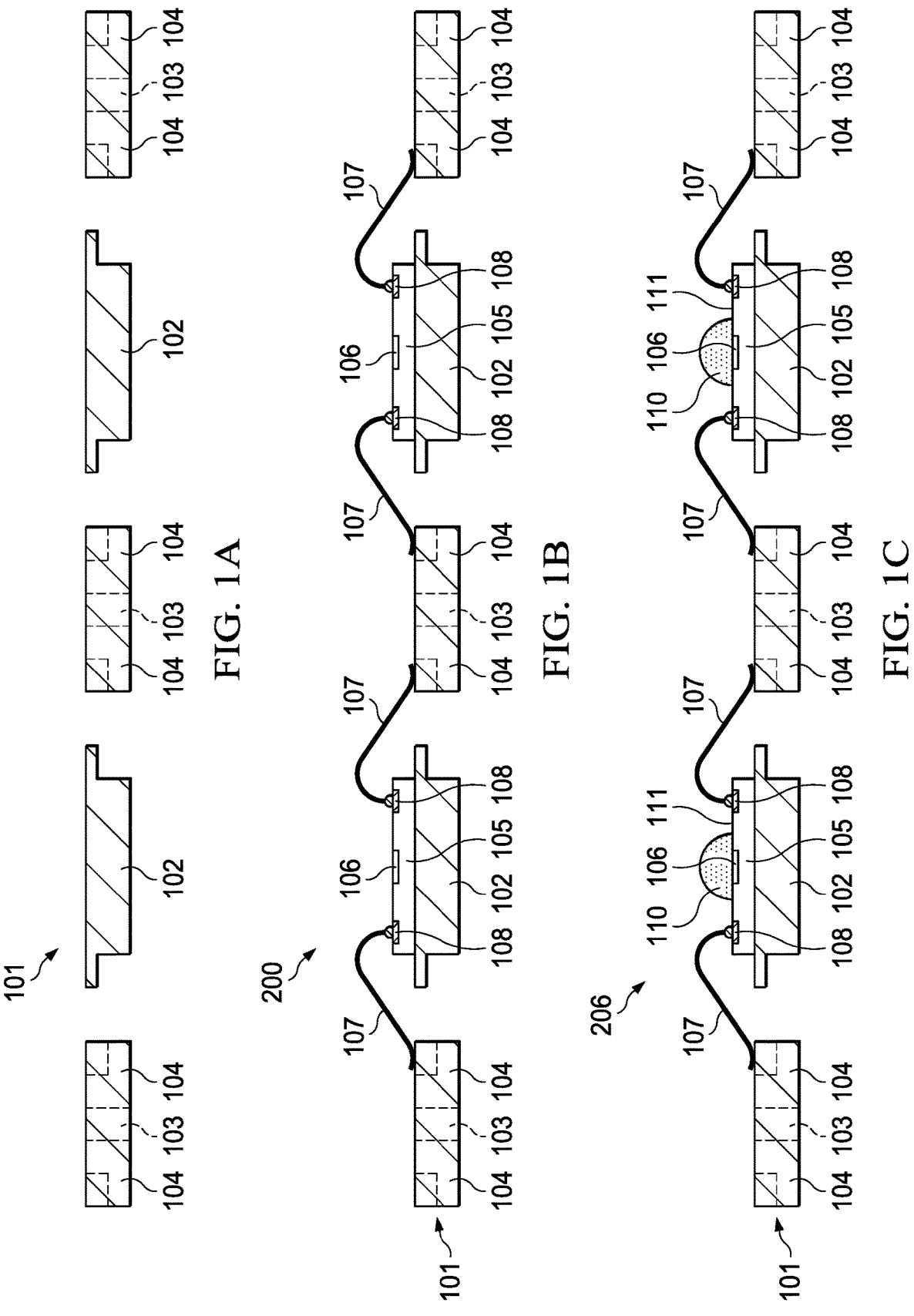

FIG. 1A is a cross section view of a portion of a lead frame strip 101 having die attach pad (DAP) portions 102 and tie bar portions 103. The tie bar portions 103 may include, for example, lead segments 104 and other cross tie bar segments (not shown) for attaching the tie bar portions 103 to DAP portions 102. Lead frame strip 101 may be provided, for example, by a lead frame supplier to be used in the manufacture of a semiconductor device.

FIG. 1B illustrates semiconductor dies 105 that are mounted on the DAP portions 102 of lead frame strip 101 using an adhesive layer (not shown). The semiconductor dies 105 include a sensor area 106. In various examples, sensor area 106 may be a moisture-sensitive polymer that is used for humidity sensing, an electrochemical cell that is used for gas sensing, or another sensor type for detecting other environmental conditions. Electrical connections to each semiconductor die 105 are made by bonding wires 107 from bond pads 108 on the surface of the die 105 to the lead segments 104.

FIG. 2A is an isometric view of structure 200 that corresponds to the cross section shown in FIG. 1B. Dies 105 are mounted on the DAP portions 102 of lead frame strip 101. Bond pads 108 are coupled to lead segments 104 on tie bar 103 using bond wires 107. Semiconductor dies 105 may include additional bond pads 201 that are coupled to additional lead segments 202 on lead frame strip 101 using bonding wires 203. FIG. 2A shows cross tie bars 204 that are used to attach DAP portions 102 to tie bar 103. Additional cross tie bars 205 attach the DAP portions 102 to other sections of lead frame strip 101 (not shown).

Referring to FIG. 1C, a sacrificial material 110 is attached to the top surface 111 of each semiconductor dies 105. Various sacrificial materials 110 may be applied to top surface 111. In one example, coating agents such as the NAR and MA series from NIKKA SEIKO CO., LTD maybe used as sacrificial material 110. In some examples, sacrificial material 110 may be attached as a film or dispensed using spin coating. Sacrificial material 110 is positioned to cover at least sensor area 106 on top surface 111.

FIGS. 2B and 2C are isometric views of alternative example structures 206a,b that correspond to the cross section shown in FIG. 1C. In structure 206a (FIG. 2B), a sacrificial material 110a is attached as a film on top surface 111 to cover sensor area 106. Alternatively, in structure 206b (FIG. 2C), a sacrificial material 110b may be dispensed on top surface 111 to cover sensor area 106. The attachment method selected depends upon the sacrificial material 110 used during the manufacturing process, which in turn may depend upon the other materials used to create the semiconductor device.

Figure 1D:
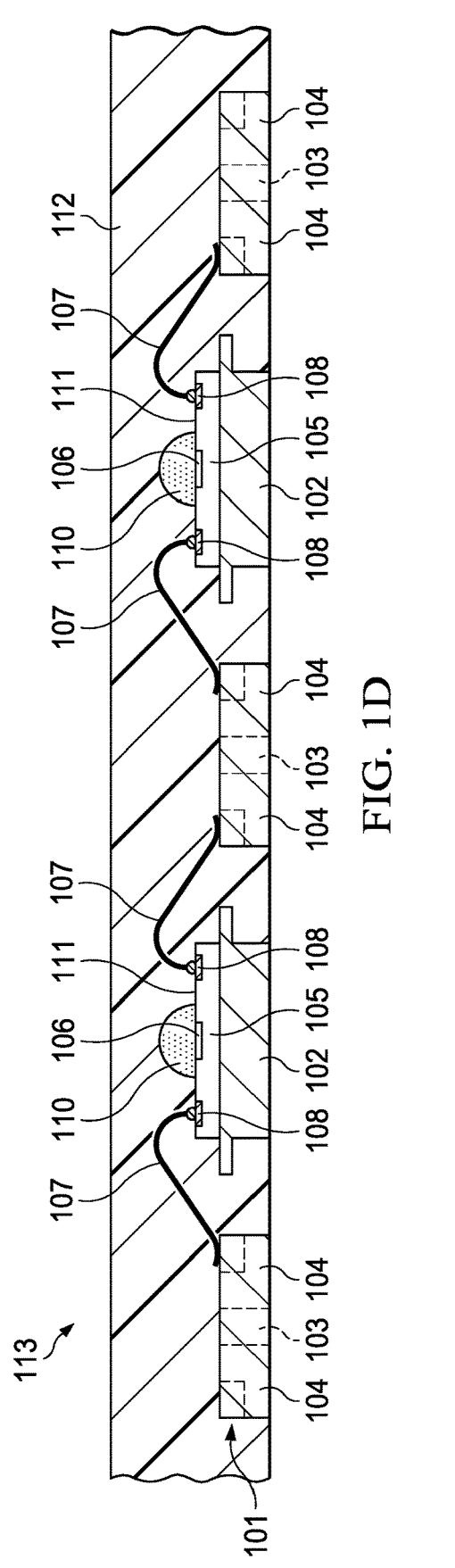

In FIG. 1D, the components have been covered or encapsulated in a mold compound 112, such as a plastic or epoxy, to form a package 113. Mold compound 112 covers lead frame strip 101, but may leave a portion of DAP portions 102, tie bars 103, and/or lead segments 104 exposed. Semiconductor dies 105, bond wires 107, bond pads 108, and sacrificial material 110 are completely covered by mold compound 112. Sensor area 106 is covered by sacrificial material 110 and, therefore, does not directly contact mold compound 112.

Figure 1E:
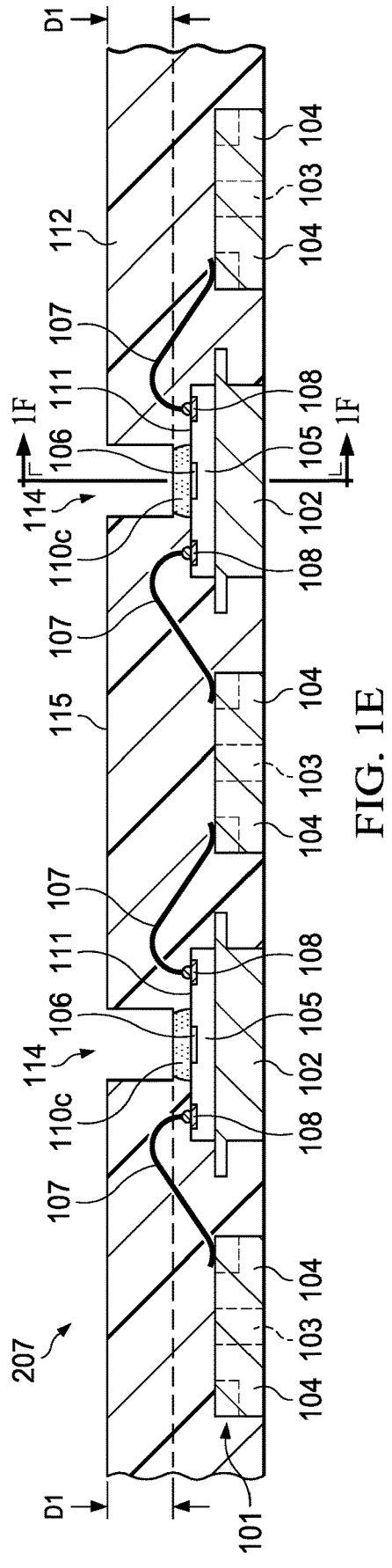

In FIG. 1E, the package 113 of FIG. 1D has been top cut by a saw blade to create channels 114 above each sensor area 106. The saw blade is set to cut at a depth D1 relative to the top surface 115 of mold compound 112. The depth D1 is selected so that the channels are cut through mold compound 112 and partially into sacrificial material 110 without touching the top surface 111 of semiconductor die 105 or sensor area 106.

Figures 1F, 1G, 1H:
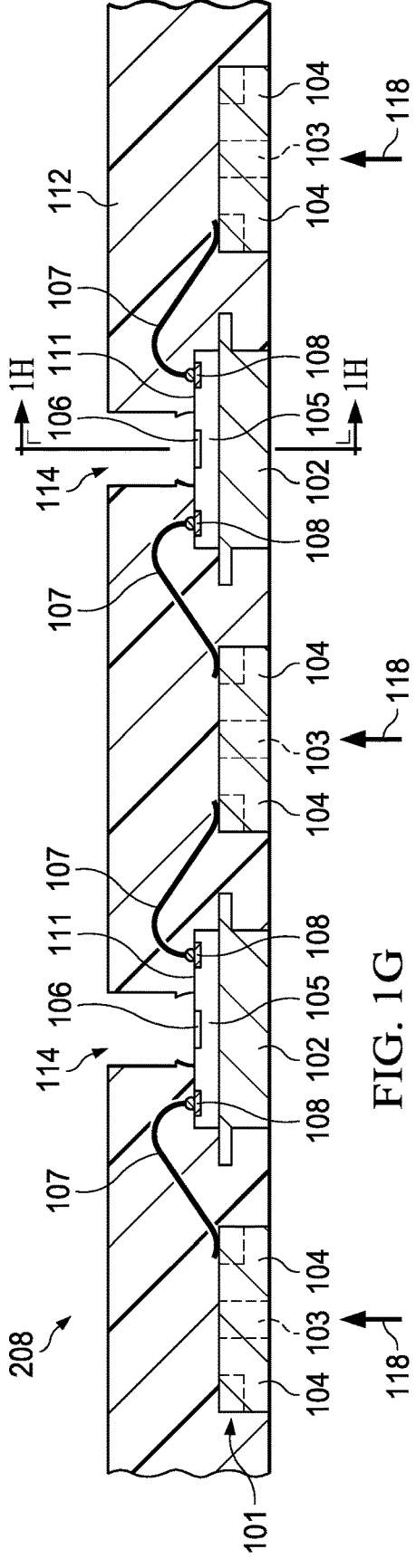

FIG. 1F is a cross section view of the structure 207 shown in FIG. 1E, which shows that channel 114 extends across the entire top portion 115 from a first side 116 to a second side 117. Channel 114 has a depth of D1 across the top portion 115, which is determined by the depth of the saw blade used to create channel 114. As shown in FIG. 1F, channel 114 is shallow enough to avoid the top surface 111 of semiconductor die 105 and sensing area 106. Channel 114 does remove a portion of the sacrificial material 110 as well as some of the top portion 115 of the mold compound 112. A portion of the sacrificial material 110c is left between channel 114 and sensing area 106. The remaining portion of sacrificial material 110c has a depth of D2, which corresponds to the distance between the top 111 of semiconductor die 105 and the bottom of channel 114, for example.

FIG. 2D is an isometric view of structure 207 that corresponds to the cross section shown in FIGS. 1E and 1F. Channel 114 extends across the mold compound 112. When the mold compound 112 is removed from channels 114, then the remaining sacrificial material 110 is exposed to the environment while allowing other components, such as semiconductor die 105, bond pads 108, lead frame segments 104, and bonding wires 107, to remain covered or encapsulated in the mold compound.

In FIG. 1G, the sacrificial material 110c that remained at the bottom of channel 114 in FIG. 1E has been dissolved to create a structure 208. In some examples, sacrificial material 110c may be dissolved using ethanol or water. In other examples, isopropyl alcohol, cyclohexane, or hot water may be used to dissolve and clear away the sacrificial material 110c. Once the sacrificial material 110c has been cleared away, the sensor areas 106 on each semiconductor die 105 are exposed to the environment. Individual integrated circuit packages may then be created by singulating each semiconductor die 105 into a separate device. Such singulation is typically accomplished via a sawing process. In a conventional mechanical saw process, a saw blade (or dicing blade) is typically advanced along saw streets 118 which extend in prescribed patterns between lead frame sections to separate the lead frame sections from one another.

FIG. 1H is a cross section view of the structure 208 shown in FIG. 1G, which shows that sacrificial material 110c has been cleared away to create a cavity 119 between channel 114 and sensor area 106. Cavity 119 has a depth of D2, which is the distance between the bottom of channel 114 and the sensing area 106, for example. Removing sacrificial material 110c exposes sensor area 106 on semiconductor die 105 to the environment, such as the atmosphere, so that sensor area 106 can detect gases or measure humidity, for example. Channel 114 has a depth of D1 and cavity 119 adds an additional depth of D2 so that sensing area 106 is recessed below the top surface 115 of mold compound 112 by depth D1+D2.

FIG. 2E is an isometric view of structure 208 that corresponds to the cross section shown in FIGS. 1G and 1H. Sacrificial material 110 has been dissolved and cleared away from both channels 114, which leaves a channel 114 so that sensor areas 106 on each semiconductor die 105 are exposed to the environment. In FIG. 2E, structure 208 has been singulated by cutting along saw street 118 to create individual integrated circuit devices 209. In the example shown, sawing along saw street 118 removes the tie bar 103 portion of lead frame 101. At least a portion of lead segments 104 and 202 are exposed on each individual device 209 to provide electrical connections to the respective semiconductor die 105.

FIG. 3A illustrates a top view of a completed integrated circuit package 209 manufactured as shown in FIGS. 1A-F and 2A-E. Sensing area 106 is exposed to the environment by channel 114. Integrated circuit package 209 has opposed sidewalls 401, 402. Channel 114 extends across the entire top portion 403 of package 209 from first sidewall 401 to second sidewall 402. Semiconductor die 105 may have additional active circuitry for processing information detected by sensing area 106. Semiconductor die 105 is accessed using lead segments 104 and 202.

FIG. 3B illustrates a bottom view of the completed integrated circuit package as shown in FIG. 3A.

FIG. 4 is a flowchart 400 illustrating a method of manufacturing a semiconductor package according to one example. In step 401, a lead frame having a plurality of die attach pads is provided. In step 402, a semiconductor device is attached to each die attach pad. The semiconductor devices have a first surface attached to the die attach pad and a second surface with a sensing area. In step 403, a sacrificial material is attached to the second surface to cover the sensing area. The sacrificial material may be applied by dispensing or spin coating in some examples. The sacrificial material may be a film applied to the second surface in other examples.

In step 404, the semiconductor devices and the sacrificial material are covered or encapsulated within a mold compound. Wire bonds may be attached from contacts on the semiconductor device to leads on the lead frame. The wire bonds, contacts, and leads may all be covered or encapsulated with the mold compound.

In step 405, a channel is cut into a top portion of the mold compound. The channel crosses through a portion of the sacrificial material that has been applied to one or more of the sensing areas. The channel may be cut, for example, using a blade saw making a pass in one direction. In step 406, the sacrificial material that is exposed by the channel is removed so that the one or more sensing areas are exposed to the environment. The sacrificial material may be removed by dissolving using water or ethanol in some examples.

While various examples of the present disclosure have been described above, it should be understood that they have been presented by way of example only and not limitation. Numerous changes to the disclosed examples can be made in accordance with the disclosure herein without departing from the spirit or scope of the disclosure. Modifications are possible in the described embodiments, and other embodiments are possible, within the scope of the claims. Thus, the breadth and scope of the present invention should not be limited by any of the examples described above. Rather, the scope of the disclosure should be defined in accordance with the following claims and their equivalents.

What is claimed is:

1. An integrated circuit package, comprising:

a die attach pad (DAP) having a top surface;

a semiconductor die having a first surface and a second surface, the first surface attached to the top surface of the DAP, the second surface having a sensing area thereon;

a mold compound covering at least a portion of the DAP and the semiconductor die;

a channel formed in a top portion of the mold compound, the channel including at least two side walls extending from a first side of the mold compound to a second side of the mold compound, the first side and the second side along a periphery of the package, the at least two side walls exposed to an environment exterior to the integrated circuit package; and a cavity formed between the channel and the sensing area so that the sensing area is exposed to the environment.

2. The integrated circuit package of claim 1, wherein the cavity is formed within the mold compound.

3. The integrated circuit package of claim 1, wherein the cavity is formed by dissolving a sacrificial material after the channel has been created by sawing the mold compound.

4. The integrated circuit package of claim 3, wherein a size of the cavity is determined by a method used to apply the sacrificial material.

5. The integrated circuit package of claim 1, further comprising:

one or more bond pads on the second surface of the semiconductor die; and the one or more bond pads each electrically coupled to a lead segment by a bonding wire.

6. The integrated circuit package of claim 1, wherein the sensing area is a gas sensor.

7. The integrated circuit package of claim 1, wherein the sensing area is a humidity sensor.

8. The integrated circuit package of claim 1, wherein the channel has a first depth in the top portion of the mold compound, and wherein the cavity has a second depth between the channel and the sensing area.

9. A sensor package, comprising:

a sensor attach area on a lead frame;

a sensor device having a first surface and a second surface, the first surface attached to the sensor attach area, the second surface having a sensing area thereon;

a mold compound covering at least a portion of the lead frame and the sensor device;

a channel formed in a top portion of the mold compound, the channel including at least two side walls extending across a width of the mold compound, the at least two side walls extend between two opposite side surfaces along a periphery of the package, the at least two side walls exposed to an environment exterior to the sensor package; and a cavity formed between the channel and the sensing area so that the sensing area is exposed to the environment.

10. The sensor package of claim 9, wherein the cavity is formed within the mold compound.

11. The sensor package of claim 9, wherein the cavity is formed by dissolving a sacrificial material after the channel has been created by sawing the mold compound.

12. The sensor package of claim 9, wherein an application method for the sacrificial material determines a size of the cavity.

13. The sensor package of claim 9, further comprising:

one or more bond pads on the second surface of the sensor device; and the one or more bond pads each electrically coupled to a lead segment by a bonding wire.

14. The sensor package of claim 9, wherein the sensing area is a gas sensor.

15. The sensor package of claim 9, wherein the sensing area is a humidity sensor.

16. The sensor package of claim 9, wherein the channel has a different cross-sectional shape than that of the cavity.

17. An integrated circuit (IC) package, comprising:

a semiconductor die including a sensor attached to a die attach pad (DAP) and electrically connected to a lead of the IC package;

a mold compound covering at least a portion of the DAP, the lead, and the semiconductor die;

a first cavity extending from a plane along a top surface of the mold compound, the first cavity extending between a plane along a first side surface of the mold compound and a plane along a second side surface of the mold compound, the first side surface and the second side surface along a periphery of the package, the first cavity exposed to an exterior environment of the IC package; and a second cavity between the first cavity and the semiconductor die, the second cavity exposed to the environment.

18. The sensor package of claim 17, wherein the semiconductor die is electrically connected to the lead via a bonding wire.

19. The sensor package of claim 17, wherein the first cavity has a cross-sectional shape different than that of the second cavity.

20. The sensor package of claim 17, wherein the sensor is one of a gas sensor and a humidity sensor.

* * * * *